(12) United States Patent
Taguchi

(10) Patent No.: US 6,306,761 B1
(45) Date of Patent: *Oct. 23, 2001

(54) METHOD OF MANUFACTURING SEMICONDUCTOR DEVICE

(75) Inventor: Mitsuru Taguchi, Tokyo (JP)

(73) Assignee: Sony Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/637,436

(22) Filed: Apr. 25, 1996

(30) Foreign Application Priority Data

May 15, 1995 (JP) .................................. P07-115404
Feb. 16, 1996 (JP) .................................. P08-029598

(51) Int. Cl.[7] .................................. H01L 21/4763
(52) U.S. Cl. .................. 438/646; 438/618; 438/622; 438/627; 438/628; 438/629; 438/632; 438/635; 438/643; 438/644; 438/648; 438/650; 438/653; 438/654; 438/656; 438/658; 438/660; 438/722; 438/906; 438/619
(58) Field of Search .................. 438/618, 622, 438/627, 628, 629, 632, 635, 643, 644, 646, 648, 650, 653, 654, 656, 658, 660, 722, 906, 619

(56) References Cited

U.S. PATENT DOCUMENTS 5,360,524 * 11/1994 Hendel et al. .................. 204/192.25
5,512,512 * 4/1996 Isobe .................................. 437/187
5,719,446 * 2/1998 Taguchi et al. ..................... 257/751

OTHER PUBLICATIONS

JAPIO AN: 95–058199, Nogami et al., JP 07058199 (abstract), 1995.*

JAPIO AN: 96–203895, Fujii et al., JP 08203895 (abstract), 1996.*

* cited by examiner

Primary Examiner—Dwayne C. Jones
Assistant Examiner—C. Delacroix-Muirheid
(74) Attorney, Agent, or Firm—Ronald P. Kananen; Rader, Fishman & Grauer

(57) ABSTRACT

A hard Al oxide film having a high melting point, which grows on the surface of an Al—Cu film during a wafer is carried in atmospheric air, obstructs the burying of a viahole with the Al—Cu film by high pressure reflow, with a result that a void remains in the hole. The present invention is intended to remove such an Al oxide film grown on the Al—Cu film formed by sputtering, by Ar[+] sputtering/etching directly before high pressure reflow. Moreover, when a Ti oxide film is present on the surface of a Ti based underlying film formed by CVD, an Al oxide film is possibly grown at the boundary between the Ti based underlying film and an Al—Cu film laminated thereon. In this case, the Ti oxide film is similarly removed directly before formation of the Al—Cu film, thereby preventing the growth of the Al oxide film. With this method, it is possible to highly keep thermal flow of a conductive film in a high pressure reflow process, and hence to desirably bury a connection hole with the conductive film.

23 Claims, 10 Drawing Sheets

METHOD OF MANUFACTURING SEMICONDUCTOR DEVICE

BACKGROUND OF THE INVENTION

The present invention relates to a method of manufacturing a semiconductor device, and particularly to a method of improving a burying characteristic in burying a recessed portion formed in an insulating film with a conductive film by high pressure reflow.

Recent VLSIs are required to integrate millions of elements on a chip of several mm square. Such a VLSI is essential to adopt a multilayer interconnection structure for suppressing an increase in area ratio of an interconnecting portion on the basis of the total chip area. The thickness of an interlayer insulating film for insulating upper and lower interconnections from each other, however, cannot be thinned more than a specified value for ensuring the insulating performance. This makes it difficult to reduce the design rule of a substrate in the vertical direction as compared with that in the horizontal direction. Moreover, from now on, such an interlayer insulating film tends to be planarized by chemical/mechanical polishing (CMP) or the like for ensuring the resolution of lithography and the reliability of an upper interconnection, and thereby a local difference in thickness is increased for the interlayer insulating film on a substrate. This tends to increase the aspect ratio of a connection hole opened in the interlayer insulating film. For example, there appears a connection hole having an aspect ratio increased up to a value of from 4 to 5.

To cope with the increased aspect ratio of a connection hole, it has come to be important to bury the connection hole with a conductive (metal) film, and various metal burying techniques such as a brancket W (tungsten)-CVD method, high temperature Al sputtering method, and Al reflow method have been examined, and partially put in practice.

The blanket W-CVD method for forming a W film over the entire surface of a substrate has been most extensively used at present from the viewpoints of an excellent burying characteristic and a high process stability. Such a technique, however, is practically used only for a plug portion (buried in a connection hole) because a Ti based adhesive layer must be formed for enhancing adhesiveness of the W film to an insulating film and the resistivity of W is higher than Al. Accordingly, this technique has various problems that an etch-back process of the W film is required; the terminal determination of the etch-back is difficult; an interconnection extracting portion to be connected to the plug portion must be formed on the interlayer insulating film by patterning of an Al film; and $WF_6$ as a source gas for the W film is expensive. These factors increase the number of processes and complicate the processes, to thereby reduce the throughput and increase the cost.

On the contrary, the high temperature Al sputtering method and the Al reflow method are advantageous in that the number of processes is smaller than the bracket W-CVD method because the plug portion and the interconnection extracting portion can be simultaneously formed by a single kind of metal. The high temperature Al sputtering method is intended to promote the surface migration of Al atoms deposited on a substrate by keeping the substrate at a high temperature during sputtering, thereby improving the burring characteristic in-situ. On the other hand, the Al reflow method is intended to form an Al film on a substrate by a usual method such as sputtering and to heat the substrate at a temperature in a range of from a recrystallization temperature of Al to a melting point (about 660° C.) of Al, thereby allowing the Al film to reflow on the substrate for burying. Each of these techniques, however, is required to heat a substrate at a temperature more than about 500–550° C. for burying, which tends to exert adverse effect on the already formed Al interconnection, to generate an Al spike on the Si substrate, or to degrade the surface planarization of the Al film itself. The burying abilities of these techniques are also low. For example, these techniques are limited to be applied to a hole having an aspect ratio less than about 2 to 3, and consequently, they are impossible to cope with the future high aspect ratio.

In view of the foregoing, a high pressure reflow method modified from the above-described Al reflow method has been proposed. This method is intended to perform-the reflow in an inert gas atmosphere at a pressure in a range of about from several tens to one hundred and several tens atm as described in "Abstracts of IEDM, pp. 105–108, 1994". This method will be described below with reference to FIG. 15.

Referring to FIG. 15, a viahole 33 is opened in a $SiO_x$ interlayer insulating film 32 covering a lower interconnection 31 in such a manner as to reach the lower interconnection 31. A Ti underlying film 34 is formed in such a manner as to cover on the inner surface of the viahole 33, and an Al—Cu conductive film 35 containing Cu in an amount of from 0.5 to 2% is formed in such a manner as to block the opening end of the viahole 33. Here, the Ti film 34, which is provided for enhancing adhesiveness between the $SiO_x$ interlayer insulating film 32 and the Al—Cu film 35, is typically formed by sputtering (hereinafter, referred to as "sputtering film").

The Al—Cu film 35 is also typically formed by sputtering. The sputtering, however, is originally poor in step coverage. In particular, when the opening diameter of the viahole 33 is fine at the sub-half micron level and the aspect ratio of the viahole is large, sputter particles are difficult to reach the bottom of the hole; and the deposited film becomes thick while forming an overhung near the opening end of the hole and then the leading ends of the overhung portions are joined to each other to block the opening end. A void 36 shown in FIG. 15 is formed by such a mechanism. The deposition profile on the wafer, however, is extremely advantageous for the high pressure reflow method intended to press the conductive film in the connection hole while applying a high pressure to the conductive film in an inert atmosphere such as Ar. With such a high pressure reflow method, the viahole 33 can be perfectly buried with the Al—Cu film 35 in the suitable condition, and the surface of the Al—Cu film 35 is planarized. At this time, an inert gas remaining in the void 36 seems to be absorbed by the Al—Cu film 35.

In addition, the high pressure reflow is performed at a substrate temperature of from 400 to 450° C., which is lower than that (about 500 to 550° C.) of the high temperature Al sputtering or a usual Al reflow. This is advantageous in preventing connection breakage of a contact portion with the Si substrate, preventing adverse effect exerted on an already formed Al interconnection, and preventing surface roughness of the Al—Cu film itself. The high pressure reflow-method can also cope with a connection hole having an aspect ratio in a range of about from 4 to 5.

Incidentally, the detail mechanism of burying a connection hole by the high pressure reflow method is not perfectly apparent; however, it is known by experience that the growth of a hard metal oxide having a high melting point on the surface of a conductive film obstructs the thermal flow of the conductive film to suppress the smooth burying. Such a metal oxide may be formed on the upper surface of a conductive film or at the boundary with an underlying film depending on the kinds of the multilayer structure, forming method and forming system of the conductive film. In each case, the metal oxide film degrades the burying characteristic. The formation of such a metal oxide film will be described with reference to FIGS. 16 and 17.

FIG. 16 shows a state that an Al oxide film 37 is grown on the surface of the Al—Cu film 35 in FIG. 15. The sputtering system used for forming the Al—Cu film 35 is usually independent from the high pressure reflow system for allowing the Al—Cu film to reflow at a high pressure, and thereby the wafer completed in sputtering is carried from the sputtering system once to atmospheric air and is carried in the high pressure reflow system. The Al oxide film 37 is formed during the wafer is carried in atmospheric air. When the viahole 33 is intended to be buried with the Al—Cu, film 35 in such a state by high pressure reflow, the burying does not proceed over a specified level, and consequently, the void 28 remains as shown in FIG. 16.

In some cases, the underlying film is first oxidized depending on the film quality of the interlayer insulating film, and the conductive film is also oxidized through the oxidation of the underlying film. Such a phenomenon is particularly generated when the step coverage is poor upon formation of the underlying film and the thickness of the underlying film on the side wall surface of the connection hole is thin. Specifically, as shown in FIG. 17, when the thickness of the Ti film 34 on the side wall surface of the viahole 33 is extremely thin and the $SiO_x$ interlayer insulating film 32 contains a large amount of OH groups due to the forming method, moisture is discharged from the $SiO_x$ interlayer insulating film 32 by heating of the substrate upon high pressure reflow, so that the Ti film 32 is converted into the Ti oxide film 39 due to the discharged moisture. Thus, the portion of the Al—Cu film being in contact with the Ti oxide film 39 is oxidized, and consequently an Al oxide film 38 is formed at the (Al—Cu)/Ti boundary. In this way, the Al oxide film 38 present at the boundary with the underlying film also exerts adverse effect on the burying characteristic.

As one of measures for solving such a problem, there has been proposed a multi-chamber system capable of continuously performing a series of processes from the sputtering of an underlying film to high pressure reflow of a conductive film without exposure of a wafer to atmospheric air. Such a system has a configuration shown in FIG. 18, wherein a load lock chamber 202 for containing a wafer cassette, $Ar^+$ sputtering/etching chamber 203, Ti sputtering chamber 204, Al sputtering chamber 205, high pressure reflow chamber 206 are connected to respective sides of a carrying chamber 201 formed in a polygonal shape (pentagonal shape, in this figure) by way of gate valves (not shown). In addition, the Ti sputtering chamber 204 can be used for forming a TiN film by reactive sputtering only by adding a nitrogen based atmosphere gas, so that it can used to continuously form a Ti film and a TiN film by changing the gas composition during the process. The wafer is carried in and from each chamber by a wafer carrying robot 207 provided in the carrying chamber 201. In this system, the wafer is exposed to atmospheric air only when carried from the load lock chamber 202. In other words, the wafer is carried in a state being shielded from atmospheric air between the other processes than carrying from the load lock chamber 202.

The multi-chamber system conceptually enables the above-described ideal processes; however, it requires a vast equipment investment, and is disadvantageous in making it impossible to make use of the existing sputtering system.

The system, which is large in size, has another disadvantage in that it occupies a large floor space in an expensive clean room. As a result, the multi-chamber system tends to increase the manufacturing cost of semiconductor devices.

On the other hand, it may be considered that the underlying film is formed by CVD in place of sputtering for improving the coverage thereof on the side wall surface of a connection hole; however, in this case, a problem is encountered in growth of a metal oxide on the underlying film. Such a problem occurring in the case of using a Ti/TiN laminated film as the underlying film will be described with reference to FIGS. 19 and 20.

Referring to FIG. 19, a field oxide film 42 ($SiO_2$) is formed on a Si substrate 41 for element isolation, an impurity diffusion area 43 being formed, and a $SiO_x$ interlayer insulating film 44 is formed. A contact hole 45 reaching the impurity diffusion area 43 is formed in the $Sio_x$ interlayer insulating film 44, and is then sequentially covered with a thin Ti film 46 and a thin TiN film 47 by CVD. The Ti film 46 reduces a natural oxide film on the surface of the Si substrate 41 and the film 46 itself is converted into a silicide, to achieve a low resistance ohmic contact. The TiN film 47 is provided for ensuring a barrier performance which is insufficient only by the Ti film 46, so that an Al—Cu film 49 (see FIG. 20) burying the contact hole 45 in the subsequent process is blocked from being penetrated in the Si substrate 41. The step coverage of each of the Ti film 46 and the TiN film 47 is excellent because it is formed by CVD. In particular, the thickness of the Ti film 46 on the side wall surface of the hole is made larger than that of the Ti film 34 shown in FIG. 15.

However, since the CVD system for forming the Ti film 46 and the TiN film 47 is independent from the sputtering system for forming an Al—Cu film 49 (see FIG. 20) in the subsequent process, the wafer must be exposed to atmospheric air once after completion of film formation by CVD. At this time, a Ti oxide film 48 is formed on the surface of the TiN film 47 as shown in FIG. 19.

When an Al—Cu film 49 is intended to be formed on the substrate and then subjected to high pressure reflow as shown in FIG. 20, an Al oxide film 50 is formed at the boundary between the TiN film 47 and the Al—Cu film 49 by oxygen diffused from the Ti oxide film 48 and it obstructs the thermal flow of the Al—Cu film 49. Accordingly, the burying of the contact hole 45 with the Al—Cu film 49 by high pressure reflow does not proceed over a specified level, as a result of which a void 51 remains. Such a problem may be solved using the multi-chamber system shown in FIG. 18 in which the CVD system is integrated with the sputtering system; however, the multi-chamber system has various physical and economical problems to be solved as described above.

As seen from FIGS. 16, 17 and 20, the Al oxide films 37, 38 and 50 finally obstruct the smooth burying of the connection hole by high pressure reflow. Specifically, the Al oxide film 37 (see FIG. 16) formed on the surface of the Al—Cu film 35 by direct oxidation due to contact with atmospheric air, and the Al oxide films 38 and 50 (see FIGS. 17 and 20) formed on the lower surfaces of the Al—Cu films 35 and 49 by secondary oxidation by way of the Ti oxide films 39 and 48, exert adverse effect on high pressure reflow.

SUMMARY OF THE INVENTION

An object of the present invention is to provide a method of manufacturing a semiconductor device, which is capable of improving a burying characteristic of a conductive film in a high pressure reflow process without a vast equipment investment.

To achieve the above object, according to a preferred mode of the present invention, there is provided a method of manufacturing a semiconductor device, including a step of burying a recessed portion formed in an insulating film on a substrate with a conductive film by high pressure reflow, wherein the high pressure reflow is performed in a state that any oxide film is not present on the conductive film.

To realize the state that any oxide film is not present on the conductive film, the present invention provides the following measures based on the generation mechanism of an oxide film on the conductive film.

(a) When an oxide film is grown on a conductive film by direct oxidation of the conductive film due to contact with atmospheric air, the oxide film is removed before high pressure reflow is performed.

(b) When there is a possibility that an oxide film is formed on the conductive film by secondary oxidation through an oxide film on an underlying film, the growth of the oxide film on the conductive film is prevented by removing the oxide film on the underlying film before formation of the conductive film.

When both the oxidation mechanisms are present, both the measures (a) and (b) must be performed. In each case, after removal of the oxide film on the conductive film or the oxide film on the underlying film, the wafer must be carried to the subsequent process before re-growth of such an oxide film.

The melting point of the conductive film is kept by removing an oxide film on the conductive film or preventing generation of such an oxide film, so that the excellent thermal flow of the conductive film can be kept upon high pressure reflow. This enables the excellent burying of a connection hole without remaining of any void in the connection hole.

DETAILED DESCRIPTION OF THE PREFERRED EMBODIMENTS

Figure 1:
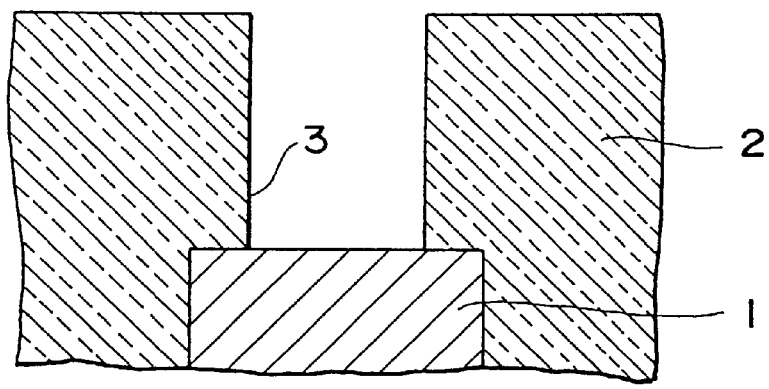
FIG. 1 is a typical sectional view of a first example in which the present invention is applied to burying of a viahole with an Al—Cu film, illustrating a state that the viahole is opened in a $SiO_x$ interlayer insulating film.

The removal of oxide films on the surface of a conductive film and/or on the surface of an underlying film is an important factor for high pressure reflow as described above. The removal of such oxide films can be performed by sputtering/etching using an inert gas such as Ar, heating of a substrate, or hydrogen plasma processing.

The above conductive film in the present invention may be made of a material containing at least one kind of Al, Cu, and Ag in the form of a single metal, alloy or intermetallic compound. Specifically, the conductive film may be made of pure Al, pure Cu, pure Ag, Al—Si, Al—Cu, Al—Si—Cu or Al—Ge. Such a conductive film is formed by, for example, sputtering.

An underlying film may be made of a Ti based material in the form of a single film or complex film in accordance with the application thereof. For example, a single Ti film is used as an underlying film to be formed in a viahole for contact with an Al based lower interconnection. On the other hand, a complex film excellent in barrier performance, such as a Ti/TiN based, Ti/TiN/Ti based or Ti/TiW based film, is used as an underlying film to be formed in a viahole for contact with a polysilicon based lower interconnection or a contact hole for contact with an impurity diffusion layer in a Si substrate.

The underlying film can be typically formed by sputtering. In particular, in the case where the underlying film is made of a Ti based material and the conductive film is made of an Al based material, these films can be continuously formed by a commercial available sputtering system. In this case, there is little fear that an oxide film is grown on the underlying film. In addition, usual sputtering fails to cover a film having a sufficient thickness on the bottom surface of a connection hole having a small opening diameter and a large aspect ratio; however, such an inconvenience of the usual sputtering can be solved using a collimator/sputtering method or a long distance sputtering method. The collimator/sputtering is performed using a collimator including a honeycomb-shaped opening having a specified aspect ratio, which is inserted between a substrate and a target. On the other hand, the long distance sputtering is performed with the distance between a substrate and a target extending at about 300 mm or less (usually, about 100 mm). Each of these methods is effective to raise the number of sputter particles reaching the bottom surface of a hole by increasing a vertical incident component of sputter particles, that is, to improve the bottoming of the film in the hole.

Both a Ti film and TiN film can be formed by CVD. The Ti film can be formed by plasma CVD through $H_2$ reduction of $TiCl_4$, and the TiN film can be formed by thermal CVD or plasma CVD using a mixed gas of $TiCl_4/NH_3$. In general, CVD is superior in coverage in a connection hole to sputtering. In particular, the coverage on the side wall surface of a hole, which is difficult to be solved even by the above collimator/sputtering or long distance sputtering, can be improved by CVD.

In addition, the recessed portion formed in an interlayer insulating film in the present invention, which is to be buried with an underlying film or a conductive film, is typically a connection hole such as a contact hole or a viahole, and further it may include a groove having a depth not reaching the interlayer insulating film, and a combination of a groove and a connection hole. Such a groove is used for a so-called damascene process and dual damascene process. The damascene process involves forming a groove in an interlayer insulating film while copying an extraction pattern of an interconnection; forming a conductive film over the entire surface of a substrate; and planarizing the conductive film by chemical/mechanical polishing, thereby flatly burying the groove with the conductive film. on the other hand, the dual damascene process is modified from the damascene process, which involves forming a groove and a connection hole in an interlayer insulating film; and burying both the groove and connection hole with a conductive film; thereby simultaneously forming an interconnection extracting portion and a plug portion. Each of these processes is effective for preventing electro-migration for finer-line geometries of the future design rule or realizing a Cu interconnection difficult in dry etching. However, each process has a problem in burying a recessed portion having a high aspect ratio. The present invention is also useful for improving the burying characteristic for such a process.

The present invention will be more clearly understood with reference to the following examples.

EXAMPLE 1

In this example, the present invention is applied to burying of a viahole with an Al—Cu film. A sample wafer was prepared by continuously forming a Ti underlying film and an Al—Cu conductive film by sputtering. Next, an Al oxide film that was formed on the surface of the Al—Cu film during formation of the sample wafer in atmospheric air, was removed in an $Ar^+$ sputtering/etching chamber attached to a high pressure reflow system, and the sample wafer was immediately subjected to high pressure reflow.

Figure 7:
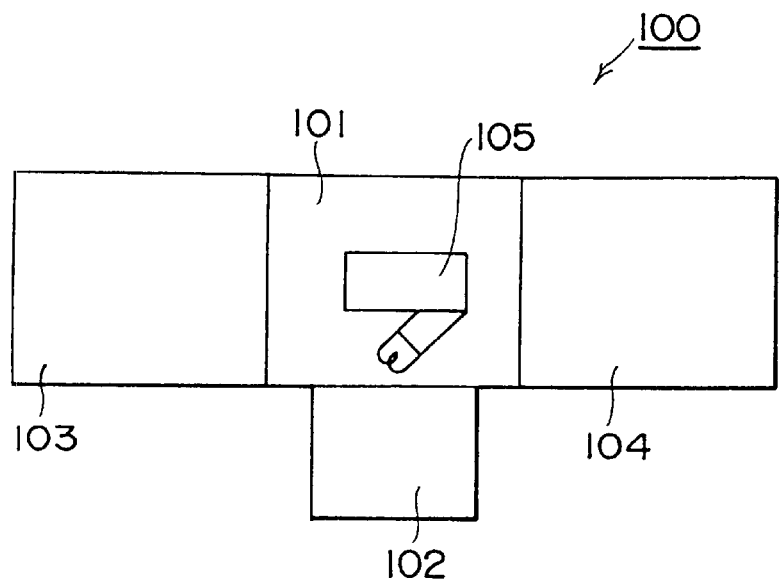
FIG. 7 is a typical sectional view illustrating the configuration of a high pressure reflow system attached with an $Ar^+$ sputtering/etching chamber, which is used for the present invention.
Figure 18:
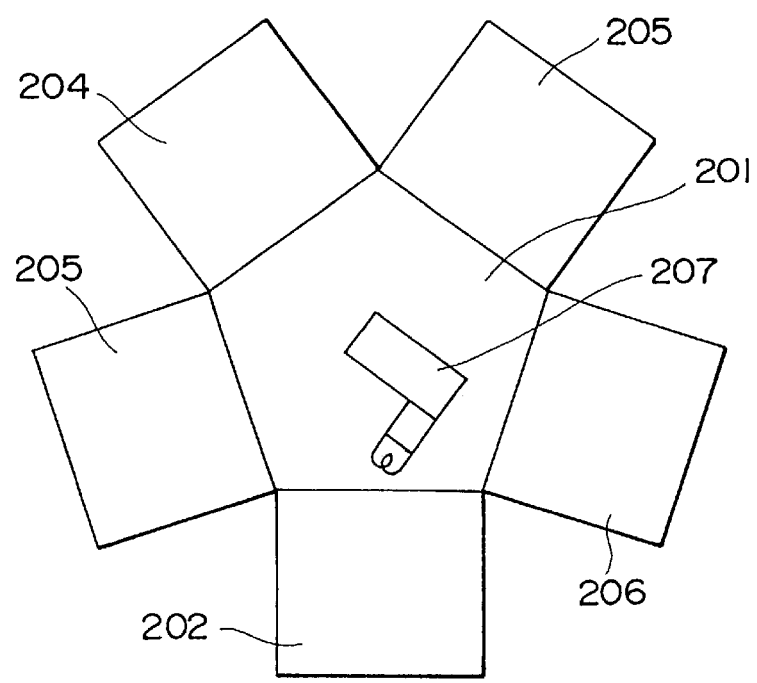
FIG. 18 is a typical plan view showing the concept of a related art multi-chamber system for continuous processing from sputtering of a Ti underlying film to high pressure reflow.
Figure 19:
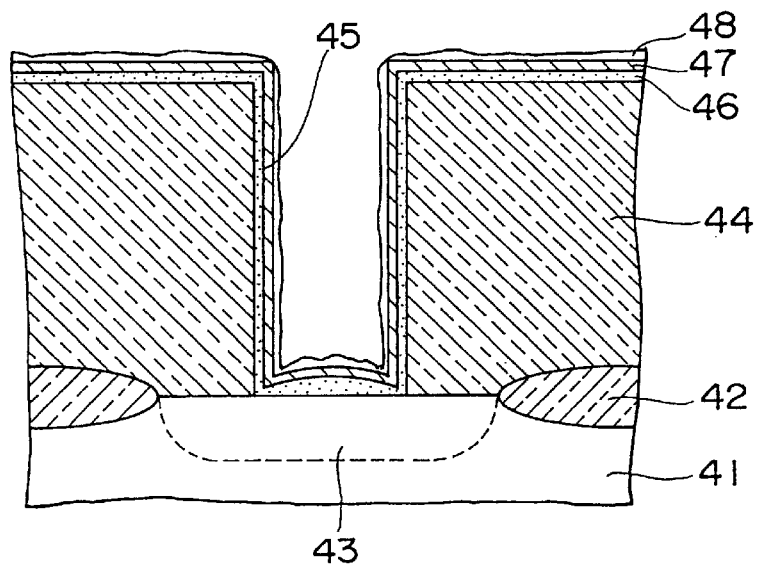
FIG. 19 is a typical sectional view of a related art in which a contact hole is buried with an Al—Cu film, illustrating a state that a Ti/TiN underlying film is formed by CVD and a Ti oxide film is grown on the surface of the TiN film during the wafer is carried to a sputtering system in atmospheric air.
Figure 20:
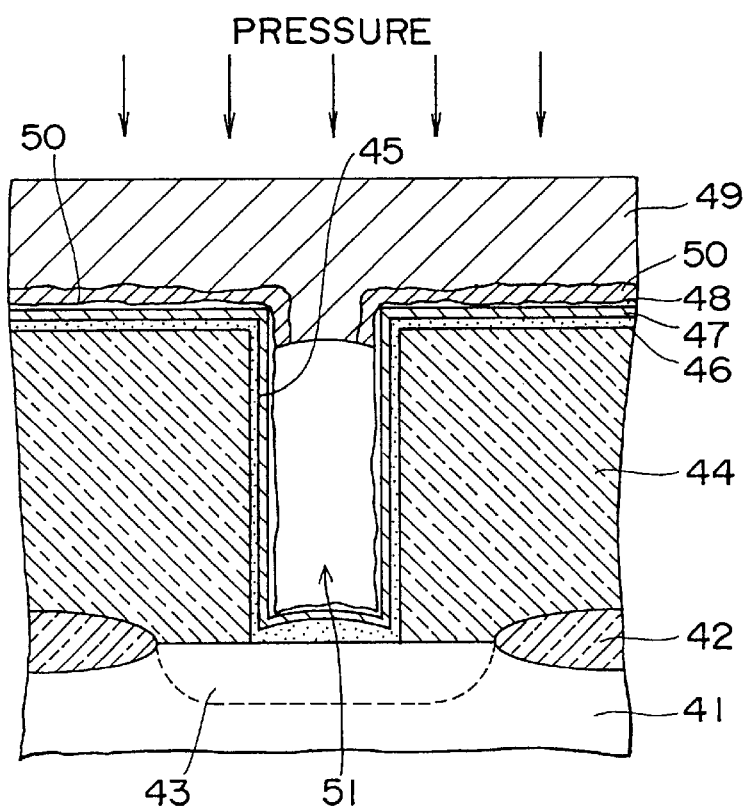
FIG. 20 is a typical sectional view illustrating a state that high pressure reflow is obstructed by growth of an Al oxide film at the (Al—Cu)/TiN boundary through the Ti oxide film shown in FIG. 19.

Here, prior to description of the high pressure reflow process, the high pressure reflow system used for the present invention will be described with reference to FIG. 7. Referring to FIG. 7, the high pressure reflow system 100 includes a rectangular carrying chamber 101, a load lock chamber 102 for containing a wafer cassette, an $Ar^+$ sputtering/etching chamber 103, and a high pressure reflow chamber 104. The load lock chamber 102, $Ar^+$ sputtering/etching chamber 103 and high pressure reflow chamber 104 are each connected to three sides of the carrying chamber 101 by way of gate valves (not shown). A wafer is carried into/from each chamber by a wafer carrying robot 105 provided in the carrying chamber 101. A wafer in this system is exposed to atmospheric air only when carried from the load lock chamber 102. In other words, a wafer is carried in a state being shielded from an atmospheric environment except that it is carried from the load lock chamber 102. Such a system configuration is advantageous in saving the equipment investment and the installation floor space as compared with the above-described multi-chamber system (see FIG. 18) integrated with even the Ti sputtering chamber and the Al sputtering chamber.

Next, the high pressure reflow process in this example will be described with reference FIGS. 1 to 6.

As shown in FIG. 1, a lower interconnection 1 made of an Al based material or the like was formed by a usual LSI process; a $SiO_x$ interlayer insulating film 2 was formed over the entire surface of a substrate by CVD; and a viahole 3 (diameter: about 0.4 µm, depth: 0.6 µm) reaching the lower interconnection 1 was formed in the $SiO_x$ interlayer insulating film 2 by photolithography and RIE (Reactive Ion Etching).

Figure 2:
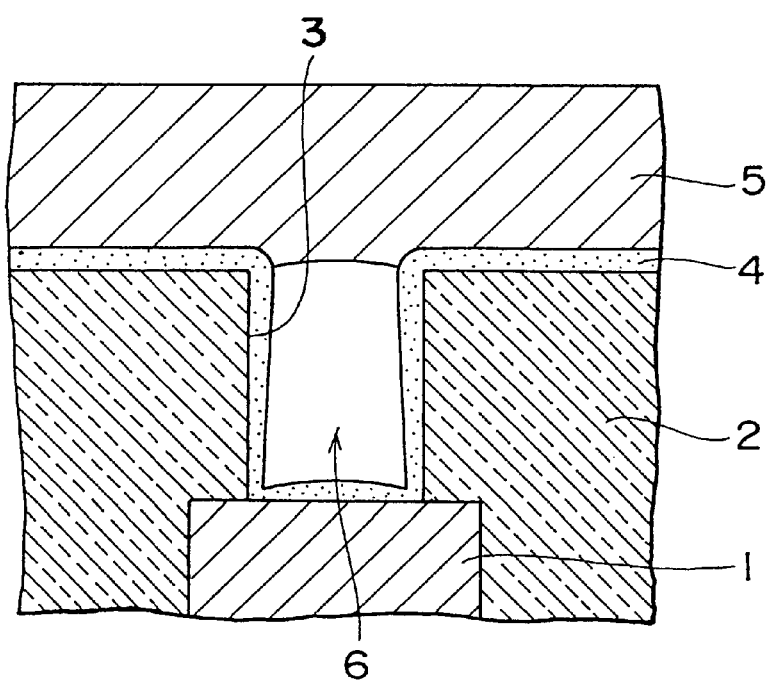
FIG. 2 is a typical sectional view illustrating a state that a Ti underlying film for covering the viahole shown in FIG. 1 and an Al—Cu film for blocking the opening of the viahole are formed by sputtering.

Next, as shown in FIG. 2, a Ti underlying film 4 and an Al—Cu conductive film 5 (containing Cu in an amount of from 0.5 to 2%) were sequentially formed by usual magnetron-sputtering. These films can be continuously formed using the existing sputtering system of a multi-chamber type in which a Ti sputtering chamber and an Al sputtering chamber are connected to each other by means of a vacuum carrying means. The formation condition of the Ti film 4 was specified, for example, as follows:

flow rate of Ar: 100 SCCM pressure: 0.4 Pa

DC power: 4 kW wafer temperature: 200° C.

film thickness: 100 nm

The formation condition of the Al—Cu film 5 was, for example, as follows:

flow rate of Ar: 100 SCCM
pressure: 0.4 Pa
DC power: 15–20 kW
wafer temperature: 200–500° C.
film thickness: 100 nm It is to be noted that the DC power was set at 20 kW in this example. The Al—Cu film 5 was thus formed in such a manner as to block the opening end of the viahole 3, and a void 6 was formed in the viahole 3.

Figure 3:
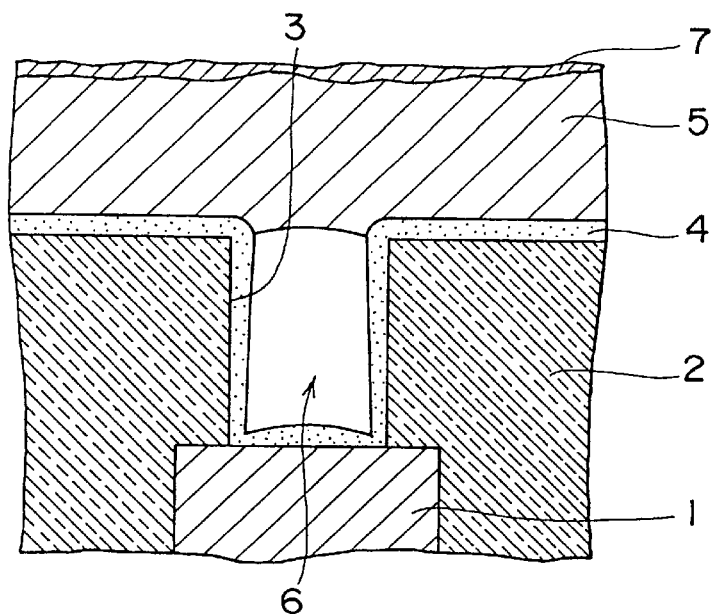
FIG. 3 is a typical sectional view illustrating a state that an Al oxide film is grown on the surface of the Al—Cu film during the wafer shown in FIG. 2 is carried to a high pressure reflow system in atmospheric air.
Figure 4:
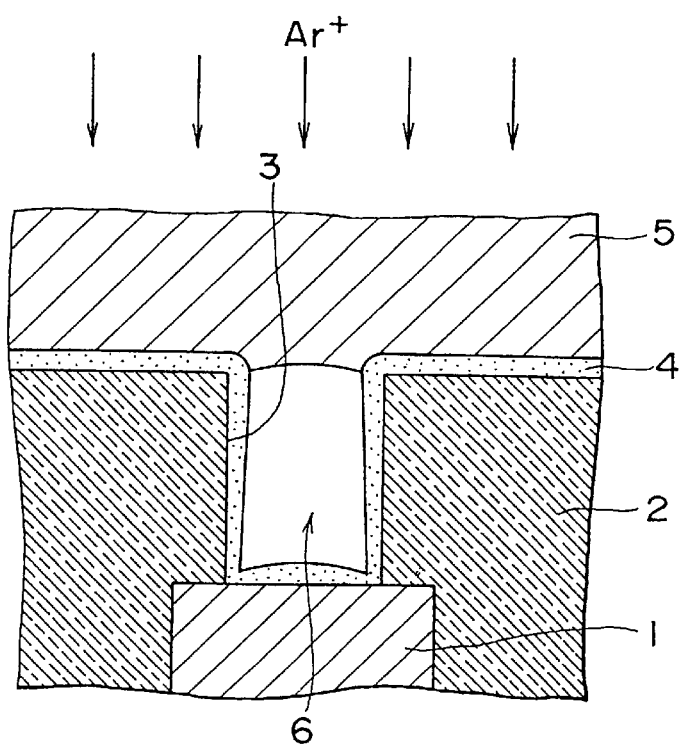
FIG. 4 is a typical sectional view illustrating a state that the Al oxide film shown in FIG. 3 is removed by $Ar^+$ sputtering/etching in a chamber attached to the high pressure reflow system.
Figure 5:
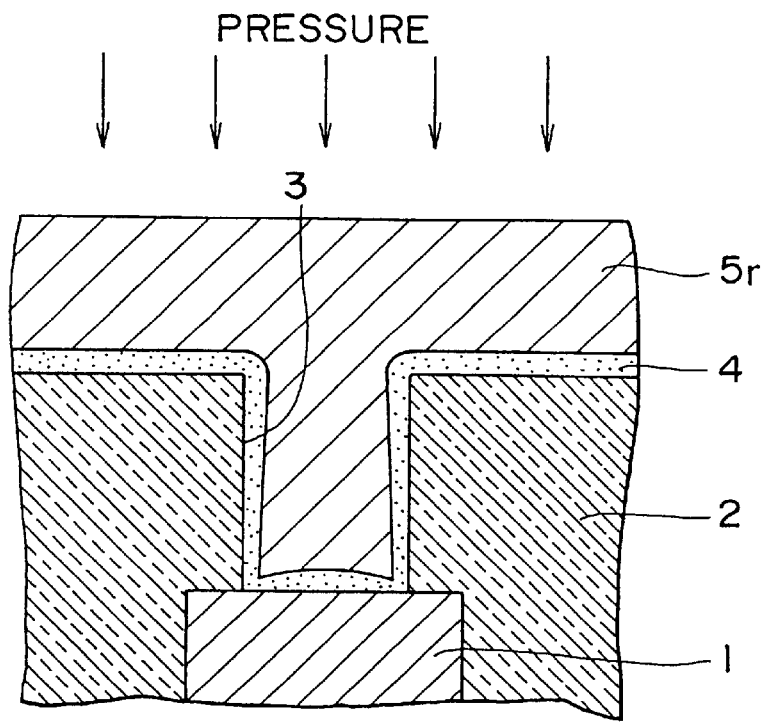
FIG. 5 is a typical sectional view illustrating a state that the viahole is buried with the Al—Cu film shown in FIG. 4 by high pressure reflow.

After that, the sample wafer was taken from the sputtering chamber to atmospheric air, and was carried to the high pressure reflow system 100 shown in FIG. 7. While the sample wafer was thus carried, an Al oxide film 7 was formed on the surface of the Al—Cu film 5 as shown in FIG. 3. The natural oxidation is inevitably generated so long as the high pressure reflow system is independent from the sputtering system. In particular, the high pressure reflow process, which takes a long period of time for pressing, is easy to become a rate-determining process among a series of manufacturing processes for semiconductor devices. Consequently, when the high pressure reflow process is introduced in a mass-production line, there is a large possibility in generation of a long waiting time for carrying a wafer in the high pressure reflow system. This further increases the opportunity for natural oxidation.

In this example, the sample wafer was first carried from the load lock chamber 102 to the Ar$^+$ sputtering/etching chamber 103 by way of the carrying chamber 101, and the Al oxide film 7 was removed in the Ar$^+$ sputtering/etching chamber 103. The sputtering/etching condition of the Al oxide film 7 was, for example, as follows:

flow rate of Ar: 100 SCCM
pressure: 0.4 Pa
RF power: 1000 V (13.56 MHz)
wafer temperature: 200° C.

The sputtering/etching allows the surface of the Al—Cu film 5 with no oxide film to be exposed. It is to be noted that the Ar excitation type in the above sputtering/etching may be replaced with the other plasma exciting type such as DC excitation or induction coupling.

Next, the sample wafer was carried in the high pressure reflow chamber 104 filled with Ar gas. The high pressure reflow was performed, for example, at a pressure of 10 Pa or more and at a temperature of about from 300 to 500° C. The viahole 3 was thus desirably buried with an Al—Cu film 5r (the suffix "r" indicates the reflow film and the same rule applies correspondingly to the following).

Figure 6:
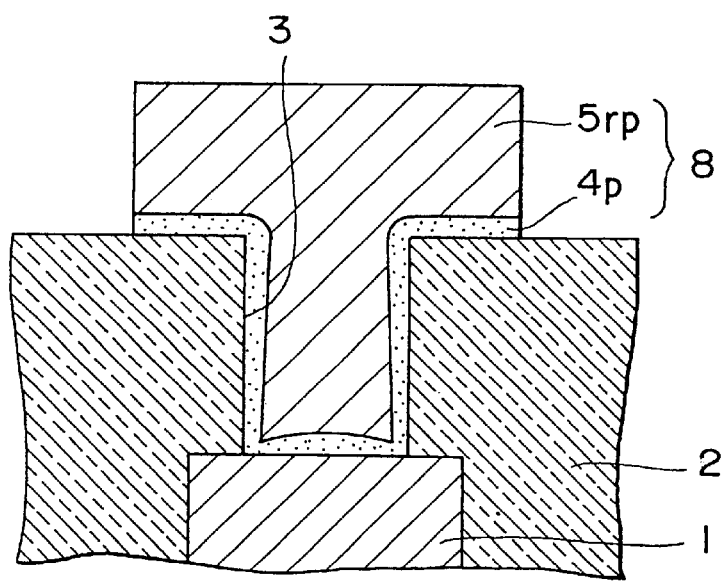
FIG. 6 is a typical sectional view illustrating a state that an upper interconnection is formed by patterning the Ti underlying film and the Al—Cu film shown in FIG. 5.

The Al—Cu film 5r and the Ti film 4 were then patterned by usual photolithography and dry etching, to form an upper interconnection 8 shown in FIG. 6. It is to be noted that the film after patterning is indicated by the original reference number added with a suffix "p" and the same rule applies corresponding to the following.

In this example, since the Al oxide film 7 was removed in the Ar$^+$ sputtering/etching chamber attached to the high pressure reflow chamber directly before the high pressure reflow as described above, the sample wafer can be exposed to atmospheric air until being processed in the Ar$^+$ sputtering/etching chamber. This makes it possible to utilize the existing sputtering system and hence to reduce the manufacturing cost for semiconductor devices.

EXAMPLE 2

In this example, the present invention is applied to burying of a contact hole with an Al—Cu film. A sample wafer was prepared by continuously forming, by sputtering, a Ti/TiN/Ti(or TiN) laminated film as an underlying film and an Al—Cu conductive film. Next, an Al oxide film formed on the surface of the Al—Cu film during the sample wafer was carried in atmospheric air, was removed in an Ar$^+$ sputtering/etching chamber attached to a high pressure reflow system, and the sample wafer was immediately subjected to high pressure reflow. This process will be described with reference to FIGS. 8 to 10.

Figure 8:
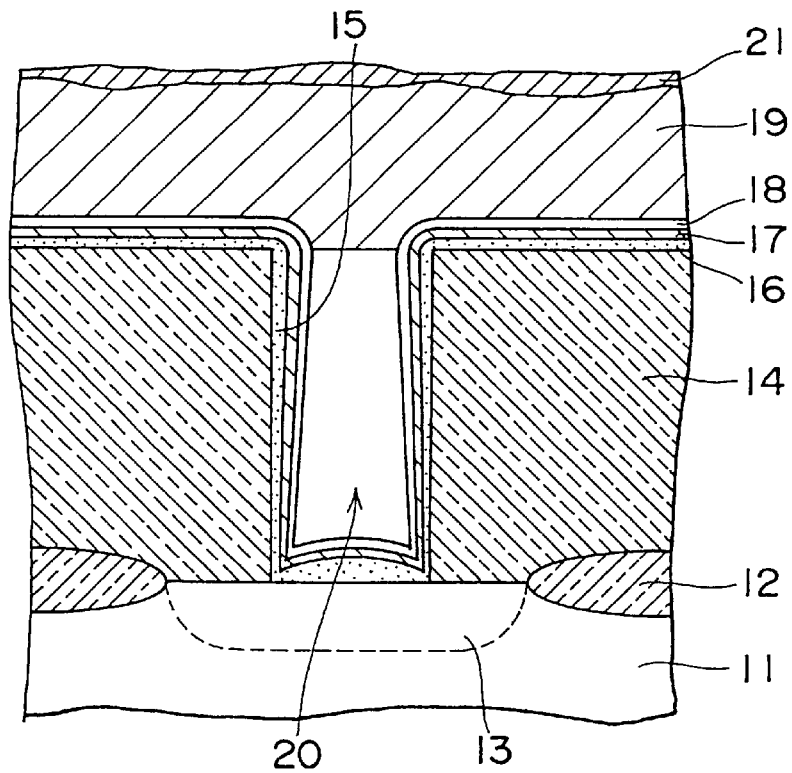
FIG. 8 is a typical sectional view of a second example in which the present invention is applied to burying of a contact hole with an Al—Cu film, illustrating a state that a Ti/TiN/Ti(or TiN) underlying film for covering the contact hole and an Al—Cu film for blocking the opening of the contact hole are formed by sputtering and an Al oxide film is grown on the surface of the Al—Cu film during the wafer is carried to a high pressure reflow system in atmospheric air.
Figure 9:
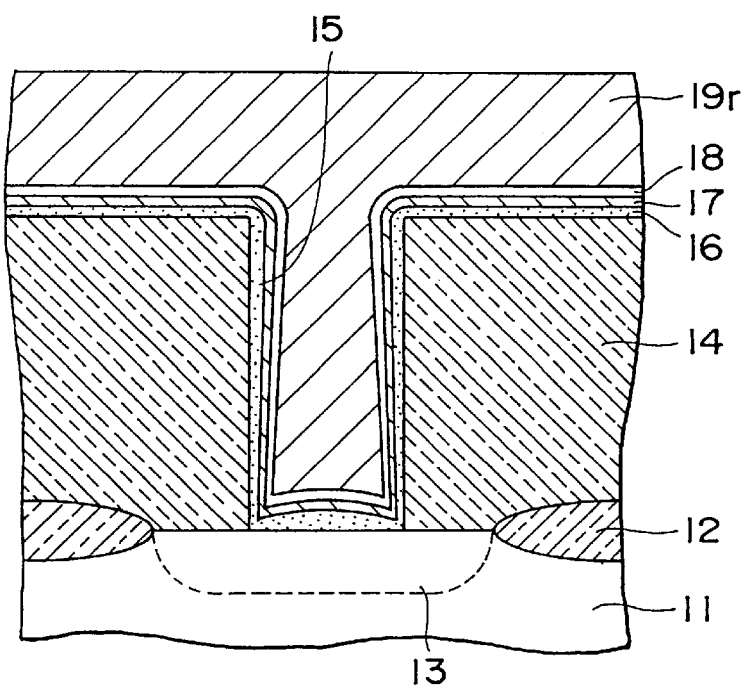
FIG. 9 is a typical sectional view illustrating a state that the Al oxide film shown in FIG. 8 is removed and the contact hole is buried with the Al—Cu film by high pressure reflow.

As shown in FIG. 8, a field oxide film 12 (SiO$_2$) was formed on a Si substrate 11 for element isolation, an impurity diffusion area 13 being formed, and a SiO$_x$ interlayer insulating film 14 was formed. Subsequently, a contact hole 15 reaching the impurity diffusion area 13 was formed in the Sio$_x$ interlayer insulating film 14. The surface of the contact hole 15 was sequentially covered with a Ti thin film 16, a TiN thin film 17 and a Ti (or TiN) thin film 18. An Al—Cu film 19 was then formed in such a manner as to block the contact hole 15.

Hereinafter, the above underlying film having the three layer structure is referred to as "Ti/TiN/Ti(or TiN) underlying film". The underlying film was formed by sputtering as follows. First, the Ti film 16 and the TiN film 17 were formed, for example, in the following conditions.

(Sputtering Condition of Ti Film 16)

flow rate of Ar: 100 SCCM
pressure: 0.4 Pa
DC power: 6 kW
wafer temperature: 200–400° C.
film thickness: 30 nm (Sputtering Condition of TiN Film 17)

flow rate of Ar: 40 SCCM
flow rate of N$_2$: 70 SCCM
pressure: 0.4 Pa
DC power: 12 kW
wafer temperature: 200–400° C.
film thickness: 70 nm The TiN film 17 was then subjected to barrier performance reinforcing process. The process was performed by, for example, lamp annealing in a N$_2$ atmosphere at 800° C. for 60 seconds. With this process, the TiN film 17 is densified. The lamp annealing may be replaced with furnace annealing.

Alternatively, grain boundaries of the TiN film 17 may be reinforced by exposing the sample wafer completed in formation of the TiN film 17 to atmospheric air for a short time for diffusing a trace amount of oxygen in the grain boundaries. In this processing, however, exposure to atmospheric air must be performed in such a manner that a Ti oxide film is not formed on the surface of the TiN film 17. This is because such a TiN film obstructs smooth high pressure reflow of an Al—Cu film as described above and one of the features of the present invention is to remove such a Ti oxide film. The removal of the Ti oxide film will be described in Examples 3 to 5.

A Ti (or TiN) film 18 was then formed again in the same condition as that for the TiN film 16 or the TiN film 17. The formation of the Ti film 18 is effective to block the contact between an Al—Cu film 19 (described later) and a Ti oxide film which is possibly formed slightly on the surface of the TiN film 17.

The Al—Cu film 19 was formed by sputtering in the same condition as that in Example 1 so as to block the opening end of the contact hole 15, and a void 20 was formed in the contact hole 15. The sample wafer was then exposed to atmospheric air after film formation, and thereby an Al oxide film 21 was formed on the surface of the Al—Cu film 19. Such a sample wafer was shown in FIG. 8.

The sample wafer was then carried in the high pressure reflow chamber 100 described in Example 1, and the Al oxide film 21 was removed in the Ar$^+$ sputtering/etching chamber 103. Subsequently, the contact hole 15 was buried with the above-described Al—Cu film 19r in the high pressure reflow chamber 104. Such a sample wafer was shown in FIG. 9.

Figure 10:
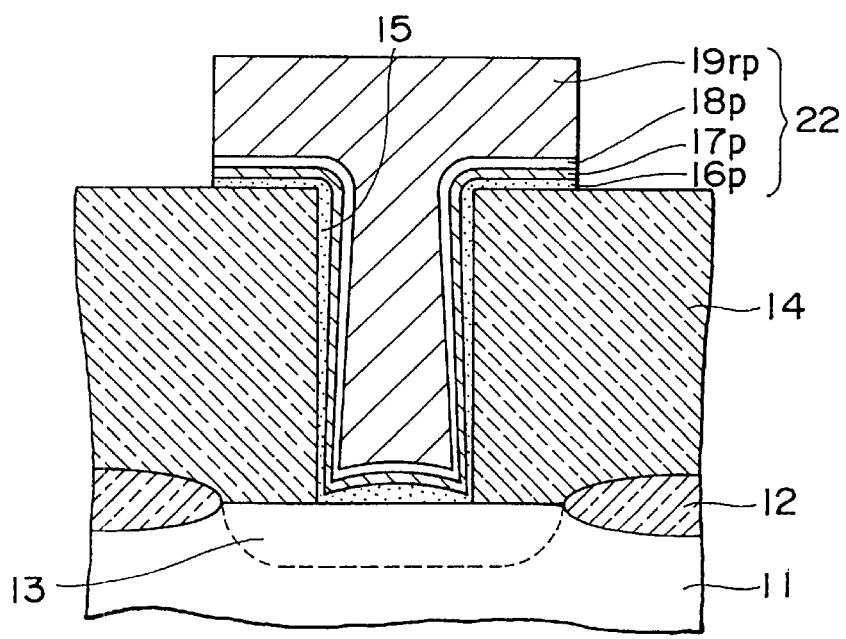
FIG. 10 is a typical sectional view illustrating a state that an upper interconnection is formed by patterning the Ti/TiN/Ti(or TiN) underlying film and the Al—Cu film shown in FIG. 9.

After that, the Al—Cu film 19r and the Ti/TiN/Ti(or TiN) underlying film were patterned by usual photolithography and dry etching, to form an upper interconnection 22 shown in FIG. 10.

EXAMPLE 3

In this example, the present invention is applied to burying of a contact hole with an Al—Cu film. A sample wafer was prepared by forming a Ti/TiN underlying film by CVD. Next, a Ti oxide film grown on the surface of the TiN film during the sample wafer was carried to the sputtering system for forming an Al—Cu film, was removed by Ar$^+$ sputtering/etching, and the sample wafer was immediately subjected to high pressure reflow. Such a process will be described with reference to FIGS. 11 to 14.

Figure 11:
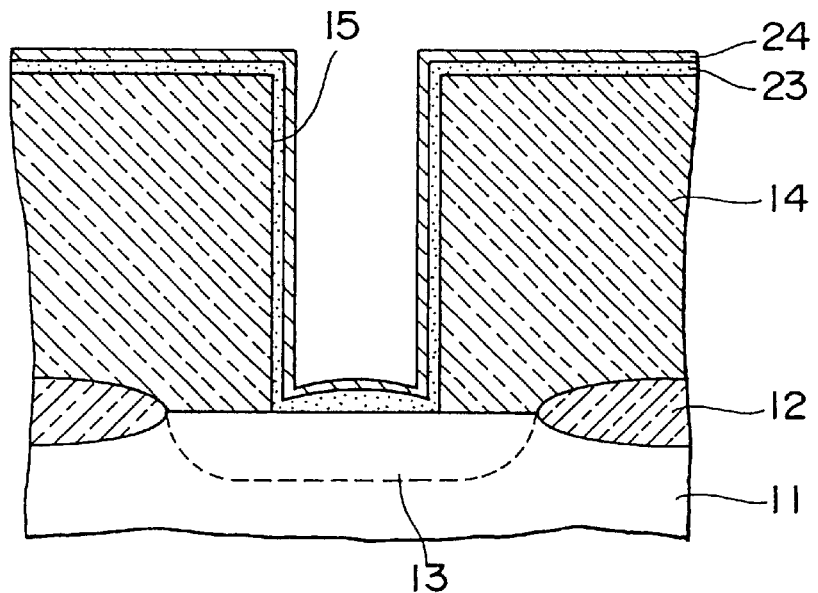
FIG. 11 is a typical sectional view of third, fourth and fifth examples in which the present invention is applied to burying of a contact hole with an Al—Cu film, illustrating a state that a Ti/TiN underlying film for covering the contact hole is formed by CVD.

First, a conformal Ti film 23 and a conformal TiN film 24 shown in FIG. 11 were first formed by Electronic Cyclotron Resonance CVD (hereinafter, referred to as "ECR-CVD").

The Ti film 23 was formed, for example, in either of the following two conditions.

(Formation Condition 1 of Ti Film 23)
    flow rate of TiCl$_4$: 10 SCCM
    flow rate of H$_2$: 50 SCCM
    pressure: 0.12 Pa
    microwave power: 2.8 kW (2.45 GHz)
    wafer temperature: 420° C.

(Formation Condition 2 of Ti Film 23)
    flow rate of TiCl$_4$: 3 SCCM
    flow rate of H$_2$: 100 SCCM
    flow rate of Ar: 170 SCCM
    pressure: 0.4 Pa
    microwave power: 2.8 kW (2.45 GHz)
    wafer temperature: 450° C.

The TiN film 24 was formed, for example, in either of the following two conditions.

(Formation Condition 1 of TiN Film 24)
    flow rate of TiCl$_4$: 20 SCCM
    flow rate of N$_2$: 8 SCCM
    flow rate of H$_2$: 26 SCCM
    pressure: 0.32 Pa
    microwave power: 2.8 kW (2.45 GHz)
    wafer temperature: 420° C.

(Formation Condition 2 of TiN Film 24)
    flow rate of TiCl$_4$: 20 SCCM
    flow rate of N$_2$: 8 SCCM
    flow rate of H$_2$: 26 SCCM
    flow rate of Ar: 170 SCCM
    pressure: 0.25 Pa
    microwave power: 2.8 kW (2.45 GHz)
    wafer temperature: 450° C.

The TiN film 24 can be formed by thermal CVD in the following condition.
    flow rate of TiCl$_4$: 40 SCCM
    flow rate of NH$_3$: 60 SCCM
    flow rate of N$_2$: 3000 SCCM
    wafer temperature: 600° C.

The laminated layer of the Ti film 23 and the TiN film 24 thus formed by CVD (hereinafter, referred to as "Ti/TiN underlying film") is superior in coverage on the side wall surface of a hole to the underlying film formed by sputtering, and is advantageous to be less susceptible to oxidation due to water discharge from the SiO$_x$ interlayer insulating film 14 or the like.

Figure 12:
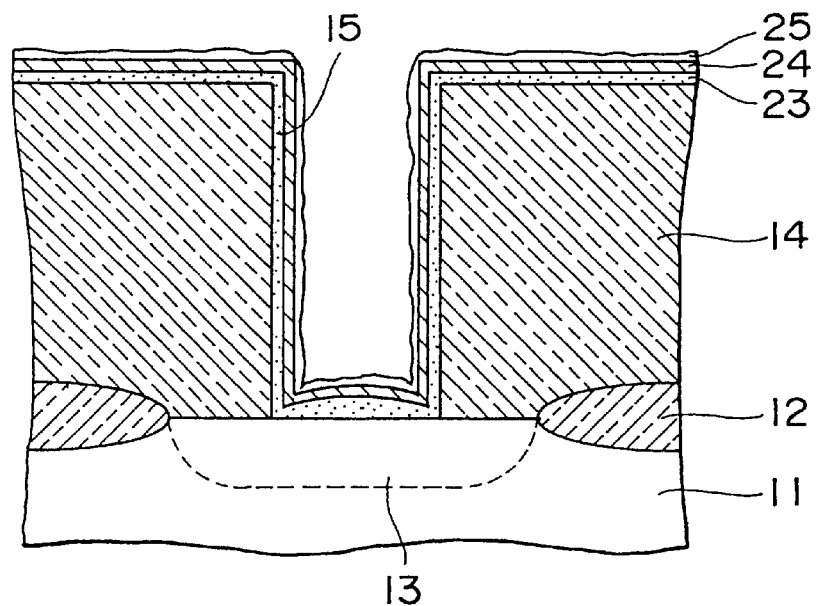
FIG. 12 is a typical sectional view illustrating a state that a Ti oxide film is grown on the surface of the TiN film during the wafer shown in FIG. 11 is carried to a sputtering system in atmospheric air.

The Ti/TiN underlying film formed by CVD, on the contrary, has a problem in which the sample wafer must be exposed to atmospheric air before formation of an Al—Cu film in the subsequent process. A Ti oxide film 25 was formed on the surface of the TiN film 24 as shown in FIG. 12 when the sample wafer was exposed to atmospheric air. The Ti oxide film 25 was removed by Ar$^+$ sputtering/etching in the following condition.

flow rate of Ar: 100 SCCM
    pressure: 0.4 Pa
    RF voltage: 1000 V (13.56 MHz)
    wafer temperature: 200° C.

The Ti oxide film 25 may be removed using an independent sputtering system. However, in the case of using a multi-chamber system in which the sputtering system for forming an Al—Cu film is connected to the other sputtering chamber, the re-growth of the Ti oxide film can be suppressed by removal of the Ti oxide film 25 in such a sputtering chamber connected to the sputtering system for forming an Al—Cu film.

Figure 13:
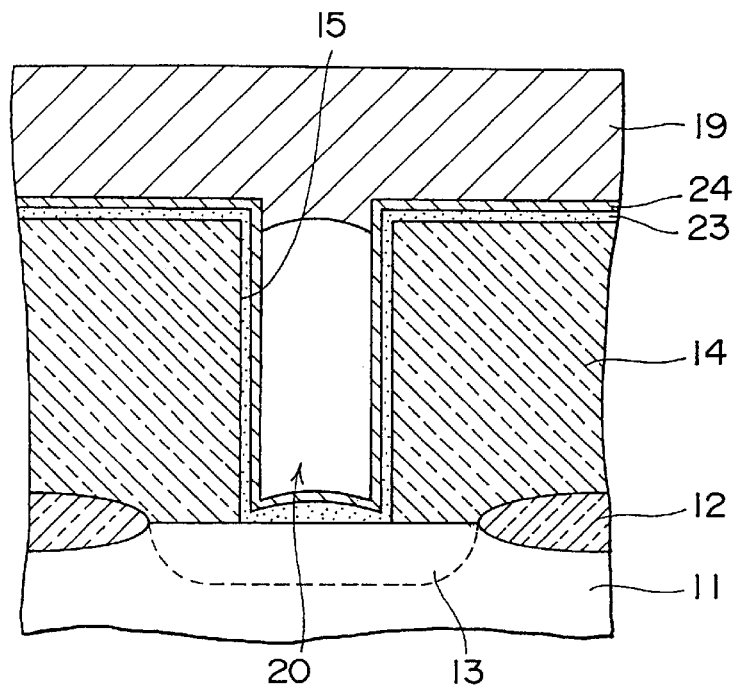
FIG. 13 is a typical sectional view illustrating a state that the Ti oxide film shown in FIG. 12 is removed by $Ar^+$ sputtering/etching and an Al—Cu film is formed so as to block the opening of the contact hole.

While not shown in FIG. 13, the additional Ti (or TiN) film may be formed on the TiN film 24 in consideration of the fear that the Ti oxide film 25 is not sufficiently removed. In many cases, the sputtering system for forming an Al—Cu film has a multi-chamber system in which it is connected to the sputtering chamber for forming a Ti based underlying film, and accordingly, the additional formation of such a Ti (or TiN) film does not lower the throughput so much. The sputtering condition for additionally forming the Ti (TiN) film is the same as that for the Ti (or TiN) film in Example 2. The film thickness of the additional Ti (or TiN) film is preferably in a range of about from 30 to 100 nm.

After that, an Al—Cu film 19 was formed, for example, in the condition described in Example 1. Such a sample wafer was shown in FIG. 13.

The sample wafer was carried into the high reflow system before an Al oxide film was not grown on the surface of the Al—Cu film 19. The high pressure reflow was performed in the following condition.

flow rate of Ar: 100 SCCM
    pressure: 7×10$^7$ Pa
    pressing time: one minute
    wafer temperature: 450° C.

Figure 14:
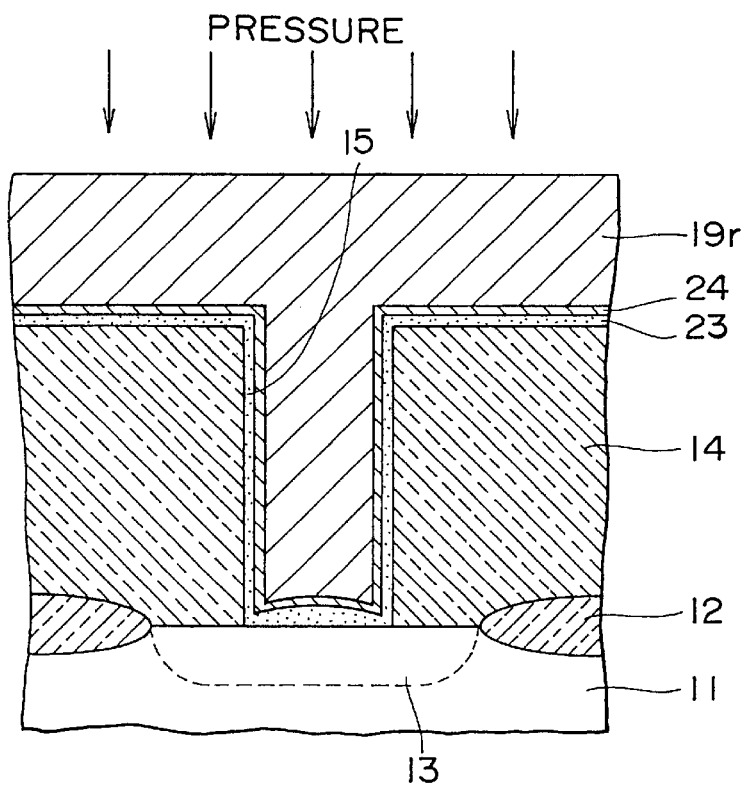
FIG. 14 is a typical sectional view illustrating a state that the contact hole is buried with the Al—Cu film shown in FIG. 13 by high pressure reflow.
Figure 15:
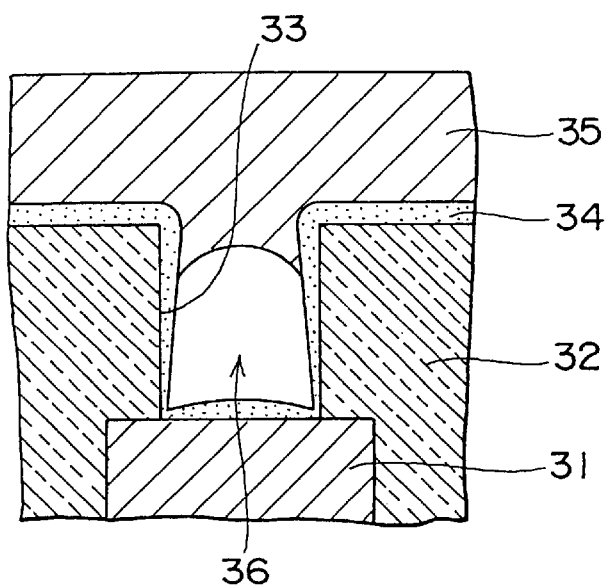
FIG. 15 is a typical sectional view of a related art in which a viahole is buried with an Al—Cu film, illustrating a state that a Ti underlying film and an Al—Cu film are formed by sputtering.
Figure 16:
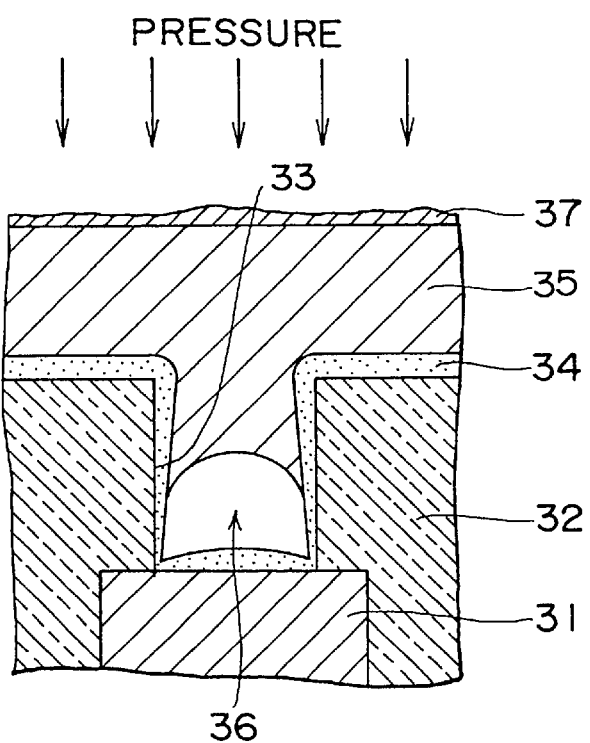
FIG. 16 is a typical sectional view illustrating a state that high pressure reflow is obstructed by the presence of an Al oxide film grown on the surface of the Al—Cu film during the wafer shown in FIG. 15 is carried to a high pressure reflow system in atmospheric air.
Figure 17:
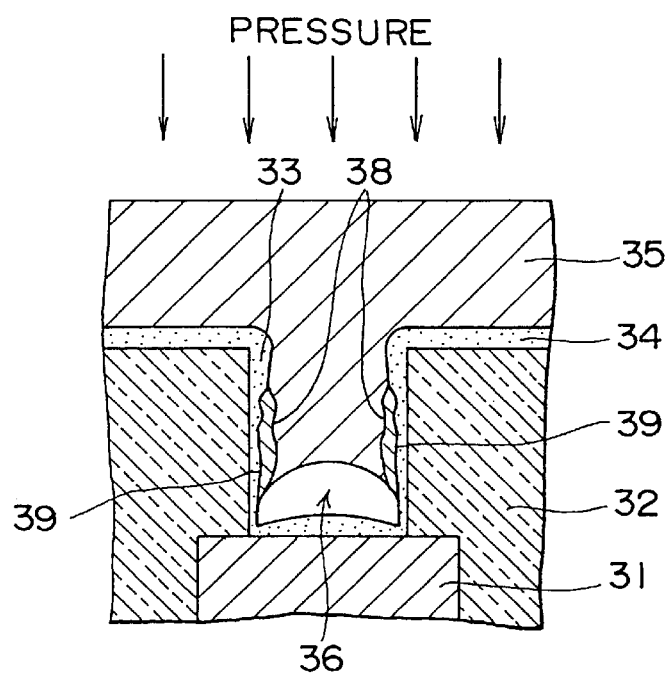
FIG. 17 is a typical sectional view illustrating a state that high pressure reflow is obstructed by growth of an Al oxide film at the (Al—Cu)/Ti boundary through oxidation of the Ti underlying film shown in FIG. 15.

The contact hole 15 was thus desirably buried with an Al—Cu film 19r as shown in FIG. 14.

EXAMPLE 4

In this example, the removal of the Ti oxide film in Example 3 is performed by heating the substrate in place of Ar$^+$ sputtering/etching. The Ti oxide film 25 grown on the surface of the TiN film 24 formed by CVD as shown in FIG. 12 was removed by heating the substrate in an Ar atmosphere, for example, in the following condition.

pressure: 200 Pa
    heating temperature: 500° C.
    heating time: three minutes The Ti oxide film 25 was sufficiently removed by the above heating. As a result, the contact hole 15 was desirably buried with the Al—Cu film 19 in the subsequent process.

EXAMPLE 5

In this example, the Ti oxide film in Example 3 is removed by $H_2$ plasma processing in place of $Ar^+$ sputtering/etching. Namely, the Ti oxide film 25 grown on the surface of the TiN film 24 formed by CVD as shown in FIG. 12 was removed using an ECR-CVD/etching system in the following condition.

flow rate of $H_2$; 100 SCCM
flow rate of Ar: 50 SCCM
pressure: 0.3 Pa
microwave power: 2.8 kW
wafer temperature: 450° C.

The Ti oxide film 25 was sufficiently removed by this heating. As a result, the contact hole 15 was desirably buried with the Al—Cu film 19 in the subsequent process.

As described above, according to the present invention, an oxide film on the surface of a conductive film is removed, or an oxide film on the surface of an underlying film which leads to the growth of an oxide film on the surface of the conductive film is removed, and thereby the thermal flow characteristic of the conductive film is prevented from being degraded due to such an oxide film. This makes it possible to desirably bury a connection hole having a micro opening diameter and a high aspect ratio and/or a groove with a conductive film. In addition, such a desirable burying can be performed at the minimum equipment investment while making full use of the existing system. Consequently, the present invention significantly contributes to attainment of finer-line geometries, high integration, and high performance of semiconductor devices by improvement in the high pressure reflow technique.

Although the present invention has been described with reference to the four examples, such description is for illustrative purposes only, and it is to be understood that the details of the manufacturing method of the present invention, such as the structure of a sample wafer, materials constituting the sample wafer, configuration of the high reflow system, sputtering condition for film formation, CVD condition for film formation, sputtering/etching condition, high pressure reflow condition, substrate heating condition, and $H_2$ plasma heating condition can be suitably selected or changed without departing from the spirit and scope of the present invention.

What is claimed is:

1. A method of manufacturing a semiconductor device, comprising:
   a first step of forming a conductive film over an underlying film in such a manner as to block the opening end of a recessed portion formed in an insulating film on a substrate, said first step being performed following the removal of an oxide film grown on a surface of said underlying film;
   a second step of removing an oxide film grown on the surface of said conductive film; and
   a third step of burying said recessed portion with said conductive film by high pressure reflow, thereby forming an interconnection.

2. A method of manufacturing a semiconductor device according to claim 1, wherein said recessed portion is a connection hole.

3. A method of manufacturing a semiconductor device according to claim 2, wherein said connection hole is a contact hole or a viahole.

4. A method of manufacturing a semiconductor device according to claim 1, wherein the removal of said oxide film in said second step is performed by sputtering/etching using an inert gas.

5. A method of manufacturing a semiconductor device according to claim 1, wherein the removal of said oxide film in said second step is performed by heating said substrate.

6. A method of manufacturing a semiconductor device according to claim 1, wherein the removal of said oxide film in said second step is performed by hydrogen plasma processing.

7. A method of manufacturing a semiconductor device according to claim 1, wherein said conductive film is made of a material containing at least one kind of Al, Cu, and Ag.

8. A method of manufacturing a semiconductor device, comprising:
   a first step of forming an underlying film while copying the opening profile of a recessed portion formed in an insulating film on a substrate;
   a second step of removing an oxide film grown on the surface of said underlying film;
   a third step of forming a conductive film in such a manner as to block the opening end of said recessed portion; and
   a fourth step of burying said recessed portion with said conductive film by high pressure reflow, thereby forming an interconnection.

9. A method of manufacturing a semiconductor device according to claim 8, wherein said recessed portion is a connection hole and/or a groove.

10. A method of manufacturing a semiconductor device according to claim 9, wherein said connection hole is a contact hole or a viahole.

11. A method of manufacturing a semiconductor device according to claim 8, wherein the removal of said oxide film in said second step is performed by sputtering/etching using an inert gas.

12. A method of manufacturing a semiconductor device according to claim 8, wherein the removal of said oxide film in said second step is performed by heating said substrate.

13. A method of manufacturing a semiconductor device according to claim 8, wherein the removal of said oxide film in said second step is performed by hydrogen plasma processing.

14. A method of manufacturing a semiconductor device according to claim 8, wherein said underlying film is a single film or a complex film made of a Ti based material.

15. A method of manufacturing a semiconductor device according to claim 8, wherein the formation of said underlying film in said first step is performed by CVD.

16. A method of manufacturing a semiconductor device according to claim 8, wherein said conductive film is made of a material containing at least one kind of Al, Cu, and Ag.

17. A method of manufacturing a semiconductor device according to claim 8, which further comprises a step of removing an oxide film grown on the surface of said conductive film between said third step and said fourth step.

18. A method of manufacturing a semiconductor device according to claim 17, wherein the removal of said oxide film is performed by sputtering/etching using an inert gas.

19. A method of manufacturing a semiconductor device according to claim 17, wherein the removal of said oxide film is performed by heating said substrate.

20. A method of manufacturing a semiconductor device according to claim 17, wherein the removal of said oxide film is performed by hydrogen plasma processing.

21. A method of manufacturing a semiconductor device according to claim 1, wherein said recessed portion is a groove.

22. A method of manufacturing a semiconductor device according to claim 1, wherein said underlying film comprises a first Ti film, a second Ti film, and a TiN film layered between said first and second Ti films.

23. A method of manufacturing a semiconductor device, comprising:

a first step of forming a Cu film over an underlying film in such a manner as to block the opening end of a recessed portion formed in an insulating film on a substrate, said first step being performed following the removal of an oxide film grown on a surface of said underlying film;

a second step of removing an oxide film grown on the surface of said conductive film; and a third step of burying said recessed portion with said conductive film by high pressure reflow, thereby forming an interconnection.

* * * * *